United States Patent
Sugimoto (10) Patent No.: US 9,774,353 B2
(45) Date of Patent: Sep. 26, 2017

(54) GENERATING APPARATUS, GENERATING METHOD AND RECORDING MEDIUM

(71) Applicant: CANON KABUSHIKI KAISHA, Tokyo (JP)

(72) Inventor: Shun Sugimoto, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 28 days.

(21) Appl. No.: 14/921,174

(22) Filed: Oct. 23, 2015

(65) Prior Publication Data

US 2016/0134306 A1 May 12, 2016

(30) Foreign Application Priority Data

Nov. 6, 2014 (JP) ................................. 2014-226204

(51) Int. Cl.
  *H03M 13/00* (2006.01)
  *H03M 13/27* (2006.01)
  *H03M 13/35* (2006.01)

(52) U.S. Cl.
  CPC ....... *H03M 13/2789* (2013.01); *H03M 13/35* (2013.01); *H03M 13/6547* (2013.01)

(58) Field of Classification Search
  CPC ......... H03M 13/2789; H03M 13/6547; H03M 13/35; H03M 13/1515; H03M 13/29; H03M 13/2906; H03M 13/373; H04J 3/07; H04J 3/247; H04L 47/10; H04L 65/607;

(Continued)

(56) References Cited

U.S. PATENT DOCUMENTS

| 8,037,395 B2 | 10/2011 | Katayama et al. |
| 2007/0002852 A1* | 1/2007 | Pekonen ................... H04J 3/07 370/389 |

FOREIGN PATENT DOCUMENTS

JP    2008016907 A    1/2008

OTHER PUBLICATIONS

Hussein Muzahim Aziz, Markus Fiedler, Håkan Grahn, Lars Lundberg, Eliminating the Effect of Freezing Frames on User Perceptive by Using a Time Interleaving Technique, 2012, pp. 1-30.*

(Continued)

*Primary Examiner* — Guerrier Merant
(74) *Attorney, Agent, or Firm* — Rossi, Kimms & McDowell LLP (57) ABSTRACT

Provided is a generating apparatus generating error-correcting code for data packet including: a first determining unit configured to determine a redundancy range for the error-correcting code; a second determining unit configured to determine a combination of a plurality of interleaving lengths indicating an interval of a plurality of data packets for which the error-correcting code is generated; and a generating unit configured to generate the error-correcting code for the data packet, based on a combination of the plurality of interleaving lengths determined by the second determining unit, wherein the second determining unit determines the combination of the plurality of interleaving lengths, such that a total redundancy of the error-correcting codes for the data packets corresponding to the combination of the plurality of interleaving lengths falls within a range of redundancy determined by the first determining unit.

12 Claims, 8 Drawing Sheets

(58) Field of Classification Search
CPC ..... H04L 47/15; H04L 47/22; H04L 47/2416; H04L 47/14
See application file for complete search history.

(56) References Cited

OTHER PUBLICATIONS

Systems for terrestrial digital sound broadcasting to vehicular, portable and fixed receivers in the frequency range 30-3 000 MHZ, 2001, pp. 1-45.*

* cited by examiner

| INTERLEAVING LENGTH | ERROR-CORRECTING CODE STRUCTURE | REDUNDANCY |
|---|---|---|
| 2 | 1, 3, 5 ... 99 →F<br>2, 4, 6 ... 100 →F | 2% |
| 3 | 1, 4, 7 ... 97, 100 →F<br>2, 5, 8 ... 98 →F<br>3, 6, 9 ... 99 →F | 3% |
| 5 | 1, 6, 11 ... 96 →F<br>2, 7, 12 ... 97 →F<br>3, 8, 13 ... 98 →F<br>4, 9, 14 ... 99 →F<br>5, 10, 15 ... 100 →F | 5% |
| 7 | 1, 8, 15 ... 92, 99 →F<br>...<br>7, 4, 21 ... 98 →F | 7% |
| 11 | 1, 12, 23 ... 89, 100 →F<br>...<br>11, 22, 33 ... 99 →F | 11% |

| INTERLEAVING LENGTH | ERROR-CORRECTING CODE STRUCTURE | REDUNDANCY |
|---|---|---|
| 10 | 1, 11, 21 ... 91 → F <br> ... <br> 10, 20, 30 ... 100 → F | 10% |
| 11 | 1, 12, 23 ... 100 → F <br> ... <br> 11, 22, 33 ... 99 → F | 11% |
| 13 | 1, 14, 27 ... 92 → F <br> ... <br> 13, 26, 39 ... 91 → F | 13% |
| 17 | 1, 18, 35 ... 86 → F <br> ... <br> 17, 34, 51 ... 85 → F | 17% |
| 19 | 1, 20, 39 ... 96 → F <br> ... <br> 19, 38, 57 ... 95 → F | 19% |
| 21 | 1, 22, 43 ... 85 → F <br> ... <br> 21, 42, 63 ... 84 → F | 21% |

| INTERLEAVING LENGTH | ERROR-CORRECTING CODE STRUCTURE | REDUNDANCY |
|---|---|---|
| 32 | 1, 33, 65 ... 993 → F <br> ... <br> 32, 64, 96 ... 1024 → F | 3.125% |
| 33 | 1, 34, 67 ... 1024 → F <br> ... <br> 33, 66, 99 ... 1023 → F | 3.222% |
| 35 | 1, 36, 71 ... 1016 → F <br> ... <br> 35, 70, 105 ... 1015 → F | 3.418% |
| 37 | 1, 38, 75 ... 1000 → F <br> ... <br> 37, 74, 111 ... 999 → F | 3.613% |
| 41 | 1, 42, 83 ... 985 → F <br> ... <br> 41, 82, 123 ... 984 → F | 4.003% |

GENERATING APPARATUS, GENERATING METHOD AND RECORDING MEDIUM

BACKGROUND OF THE INVENTION

Field of the Invention

The present invention relates to a generating apparatus, a generating method and a program.

Description of the Related Art

Currently, medium transmission using an IP (Internet Protocol) network, such as the Internet, is widely used. Particularly, an RTP (A Transport Protocol for Real-Time Applications, RFC3550, IETF) is becoming more popular. The RTP is a protocol for transmitting medium data, such as moving images and sound taken by a camera, in real time through a network. In the RTP, a UDP (User Datagram Protocol) with a faster transfer speed than a TCP (Transmission Control Protocol) is to be used in a transport layer. Although the transfer speed is fast in the UDP, there is no packet loss countermeasure or guarantee of transmission time. Therefore, a communication error needs to be handled in a layer higher than the transport layer. Particularly, the transmission data is partially lost when a packet loss occurs. In the medium transmission, the quality may be reduced due to disturbance in video or interruption of sound. Therefore, control for recovering this is necessary.

An RTP-FEC (An RTP Payload Format for Generic Forward Error Correction, RFC 5109, IETF) is known to provide error recovery capability to the RTP. The RTP-FEC is provided with a forward error correction (FEC) technique. In the RTP-FEC, redundant data based on error-correcting codes are generated for data packets to be protected, such as video and sound, and packetized error-correcting code packets are transmitted to a receiving apparatus along with the data packets.

An example of a method for generating the error-correcting codes includes a parity method based on exclusive OR (XOR). Although the calculation processing cost for generating the error-correcting code packets based on the parity method is low, errors cannot be recovered if errors occur in a plurality of data packets to be protected. Therefore, there is a method for protecting one data packet by a plurality of error-correcting code packets to increase the error resistance of the data packets to be protected (for example, see Japanese Patent Application Laid-Open No. 2008-16907). There is also a method for selecting and interleaving data packets to be protected at arbitrary intervals in order to increase the error resistance of the data packets to be protected in an environment in which consecutive errors of a plurality of packets, or so-called burst error, may occur, as in the Internet.

However, the protection of one data packet by a plurality of error-correcting code packets increases the number of error-correcting code packets and increases the amount of transmission data. Therefore, the communication band may be pressured, and the error rate may increase. The interleaving of the data packets to be protected at arbitrary intervals increases the size of the data packet blocks to be protected that are necessary for generating error-correcting code packets, and the transmission is delayed.

SUMMARY OF THE INVENTION

An object of the following embodiments is to enable to generate error-correcting codes without tightening the communication band, while maintaining the real-time property.

According to an aspect of the present invention, a generating apparatus generating error-correcting code for data packet comprises: a first determining unit configured to determine a redundancy range for the error-correcting code; a second determining unit configured to determine a combination of a plurality of interleaving lengths indicating an interval of a plurality of data packets for which the error-correcting code is generated; and a generating unit configured to generate the error-correcting code for the data packet, based on a combination of the plurality of interleaving lengths determined by the second determining unit, wherein the second determining unit determines the combination of the plurality of interleaving lengths, such that a total redundancy of the error-correcting codes for the data packets corresponding to the combination of the plurality of interleaving lengths falls within a range of redundancy determined by the first determining unit.

Further features of the present invention will become apparent from the following description of exemplary embodiments with reference to the attached drawings.

DESCRIPTION OF THE EMBODIMENTS

The present invention will now be described in detail based on exemplary embodiments of the present invention with reference to the attached drawings. The configuration illustrated in the following embodiments is just an example, and the present invention is not limited to the illustrated configuration.

First Embodiment

In the present embodiment, a communication system includes a transmitting apparatus and a receiving apparatus. The transmitting apparatus generates medium data packets, such as video and sound taken by a camera, and error-correcting code packets for protecting medium data and transmits the packets to the receiving apparatus. The transmitting apparatus and the receiving apparatus may be realized by single computer apparatuses or may be realized by distributing functions to a necessary number of computer apparatuses. When the transmitting apparatus and the receiving apparatus include a plurality of computer apparatuses, the computer apparatuses are connected by a LAN (Local Area Network) or the like, such that the computer apparatuses can communication with each other.

Figure 1:
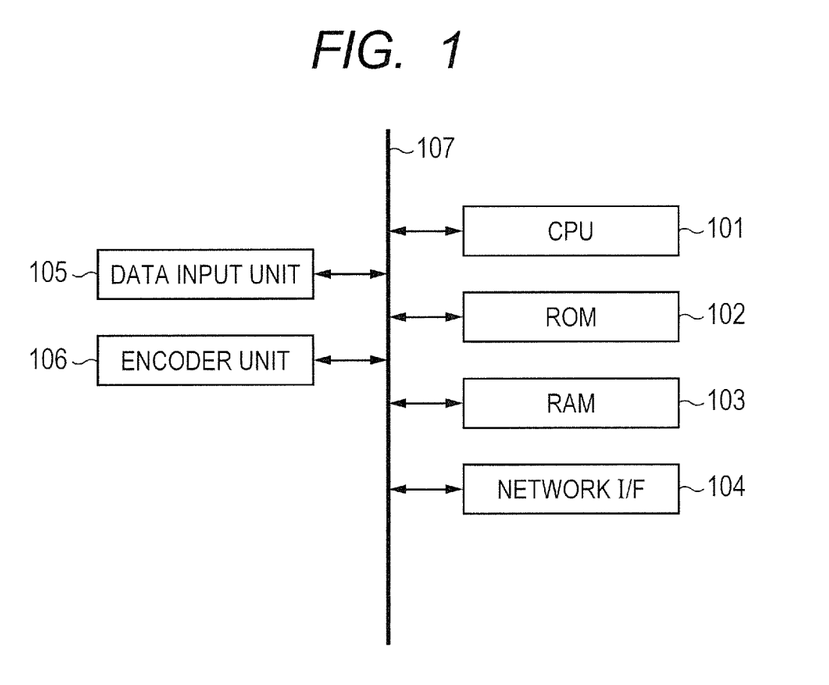
FIG. 1 is a block diagram illustrating an example of configuration of hardware.

FIG. 1 is a block diagram illustrating an example of a hardware configuration of the transmitting apparatus (generating apparatus) according to the first embodiment of the present invention. A CPU (Central Processing Unit) 101 comprehensively controls the following components. A ROM (Read Only Memory) 102 stores a control program executed by the CPU 101. A RAM (Random Access Memory) 103 functions as a main memory and a work area of the CPU 101. A network interface (I/F) 104 is an interface that can be connected to the Internet, a public wireless network or a LAN. A data input unit 105 receives medium data from a camera or a medium server. An encoder unit 106 executes a process of converting the medium data input to the data input unit 105 according to a specific coding system, such as H.265 and JPEG. A bus 107 is a transfer path of various data.

Figure 2:
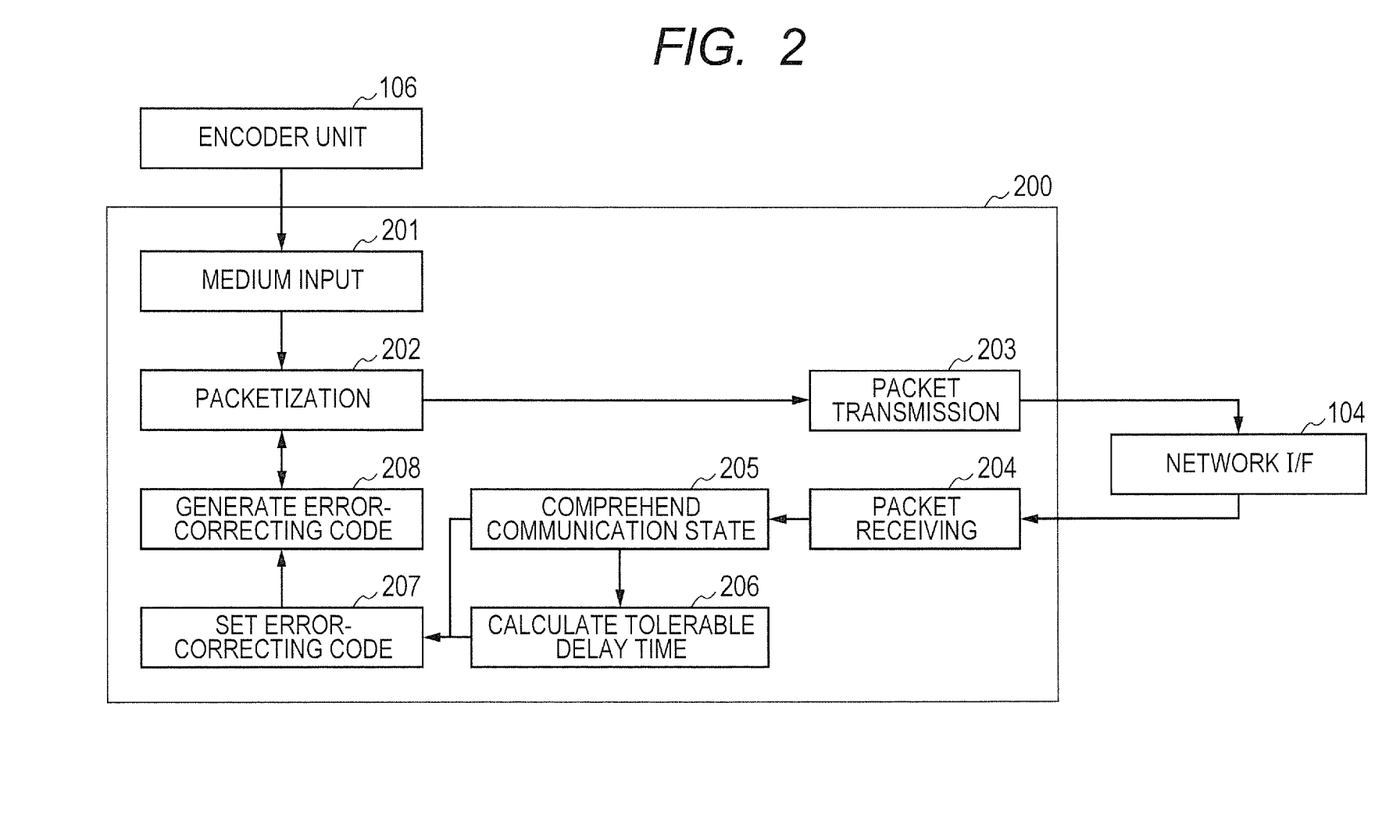
FIG. 2 is a block diagram illustrating an example of configuration of modules.

FIG. 2 is a block diagram illustrating a module configuration of a program 200 stored in the ROM 102. The CPU 101 executes modules of the program 200 to execute the following process. The medium input module 201 is a program for receiving medium data encoded by a specific coding system from the encoder unit 106.

A packetization module 202 is a program for packetizing the medium data received from the medium input module 201 according to a communication protocol. The packetization module 202 similarly packetizes error-correcting codes received from an error-correcting code generating module 208 according to the communication protocol. Although RTP/UDP is generally used in a communication system in which the real-time property is highly demanded, other communication protocols may be used, or original protocols may be used. Examples of parity packetization method of error-correcting code packets include the RTP-FEC and Pro-MPEG FEC (Pro-MPEG Code of Practice #3, release 2, Pro-MPEG Forum). These existing protocols may be used, or original headers may be defined. However, the RTP-FEC defined in RFC 5109 cannot be used when a block length described later exceeds 48.

A packet transmission module 203 is a program for transmitting packets received from the packetization module 202 to the receiving apparatus through the network I/F 104 based on a predetermined communication protocol. A packet receiving module 204 is a program for receiving packets from the receiving apparatus through the network I/F 104. Examples of the packets received here include a report packet for comprehending the communication state and a packet for notifying the buffering time in the receiving apparatus. Some of the packets described here may not be received, and other packets may be received.

A communication state comprehension module 205 is a program for comprehending the communication state from the report packet from the receiving apparatus or the buffering time notification packet in the receiving apparatus received from the packet receiving module 204. For example, the communication state comprehension module 205 calculates a packet round trip time (RTT: Round Trip Time) between the transmitting apparatus and the receiving apparatus and an error rate from the report packet and measures an available communication band from the results. Although the measuring method of the communication band is, for example, a TFRC (TCP Friendly Rate Control: Protocol Specification, RFC 5348, IETF), other methods may be used.

A tolerable delay time calculating module 206 is a program for calculating a tolerable delay time from the delay time information between the transmitting apparatus and the receiving apparatus and the buffering time in the receiving apparatus received from the communication state comprehension module 205. Although an example of the calculating method includes a method of subtracting the packet round trip time/2 and the buffering time in the receiving apparatus from the time according to the real-time property required for the communication system and setting the obtained time as the tolerable delay time in the transmitting apparatus, other methods may be used. Jitter or decode time in the receiving apparatus may be taken into account. Instead of time, the output value of the tolerable delay time may be, for example, the number of frames in the video or the number of GOPs (Groups Of Pictures) in the MPEG system.

An error-correcting code setting module 207 is a program for determining parameter setting for generating error-correcting codes from the communication state received from the communication state comprehension module 205 and the tolerable delay time received from the tolerable delay time calculating module 206. A specific setting method will be described later The error-correcting code generating module 208 is a program for generating error-correcting codes according to parameters set in the error-correcting code setting module 207, for the medium data packets received from the packetization module 202. One error-correcting code is generated by applying exclusive OR (XOR) arithmetic processing to two or more medium data. The error-correcting code generating module 208 outputs the generated error-correcting codes to the packetization module 202.

Figure 3:
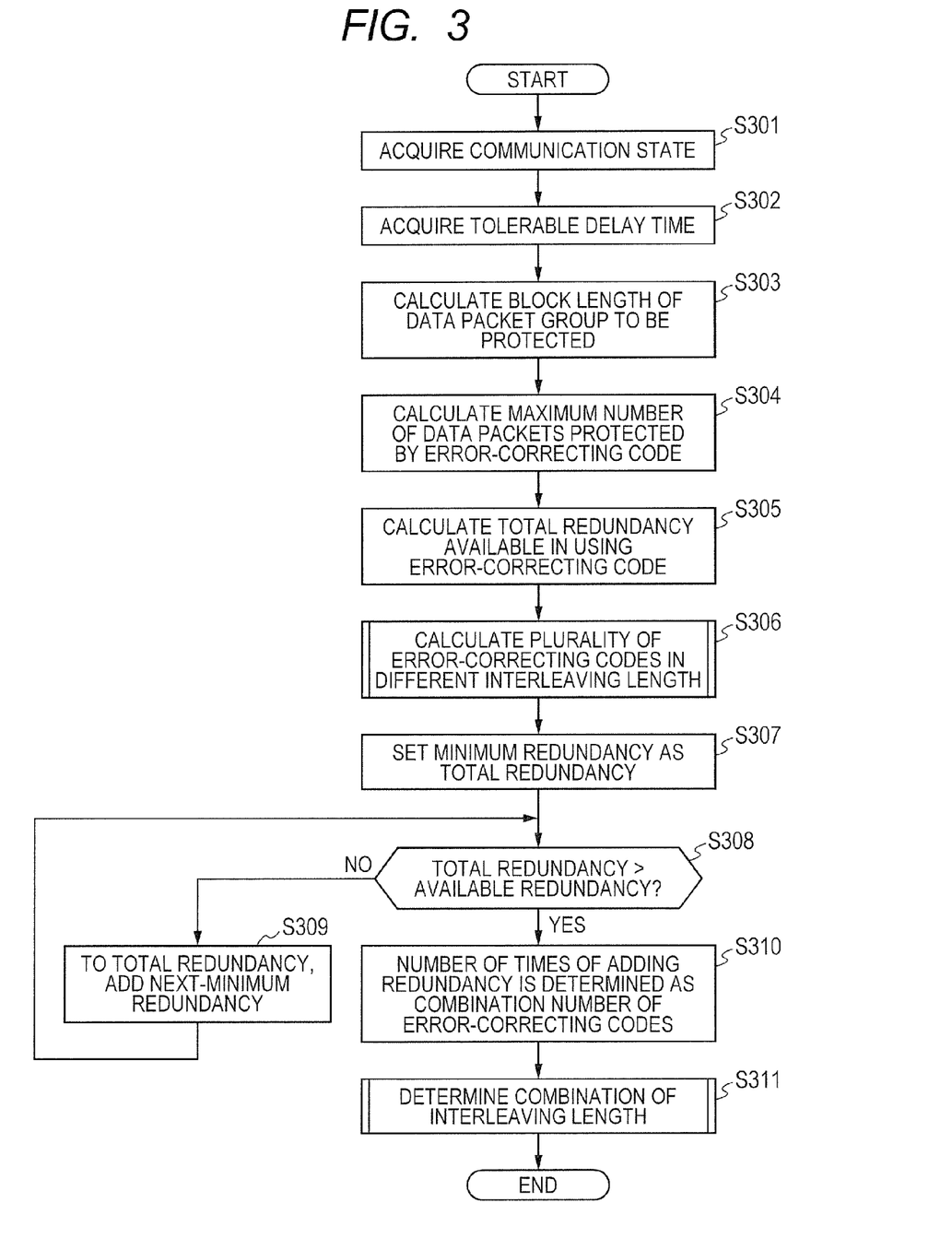
FIG. 3 is a flow chart for determining a combination of interleaving lengths.

FIG. 3 is a flow chart illustrating an example of the method of determining the parameter setting for generating the error-correcting codes through the execution of the error-correcting code setting module 207 by the CPU 101. In step S301, error-correcting code setting module 207 acquires the error rate and the packet round trip time from the communication state comprehension module 205. In step S302, the error-correcting code setting module 207 acquires the tolerable delay time or the number of tolerable delay frames from the tolerable delay time calculating module 206.

In step S303, the error-correcting code setting module (third determining unit) 207 determines a block length indicating the number of data packets selectable for generating the error-correcting codes. Specifically, the error-correcting code setting module 207 determines the block length based on the tolerable delay time or the number of tolerable delay frames acquired in step S302. For example, when the tolerable delay time is 100 msec, and the frame rate of the video is 30 fps, a range of consecutive data packet groups of three frames is the block length. The calculating method of the block length may be other methods. For example, the error-correcting code setting module 207 may comprehend an available quantity of a memory for packet buffering in the receiving apparatus and may calculate the block length according to the available quantity of the memory.

In step S304, the error-correcting code setting module (maximum data packet number determining unit) 207 determines (calculates) a maximum number of data packets protected by one error-correcting code based on the communication error rate. The calculation of the maximum number of data packets to be protected may not be necessary, and the maximum number may not be calculated. An example of the method of calculation includes a method of calculating the maximum number such that the ratio of the error-correcting code packets to the number of data packets to be protected does not fall below the error rate acquired in step S301. For example, if the error rate is 1%, the maximum number of data packets to be protected is set below 100.

In step S305, the error-correcting code setting module 207 calculates a total redundancy available for the error-correcting code packets. For example, the communication state comprehension module 205 measures the communication band based on the TFRC, and the error-correcting code setting module 207 acquires the measurement result in step S301. In step S305, the error-correcting code setting module 207 subtracts the communication band used by the data packets from the communication band acquired in step S301 and sets the obtained band as the communication band available in using the error-correcting code packets. The error-correcting setting module (first determining unit) 207 determines an available redundancy (redundancy range) of the error-correcting codes based on the calculated available communication band. For example, when the communication band available in using the error-correcting code packets is 10 Mbps, and the communication band used by the data packets is 40 Mbps, the available redundancy is 10 (Mbps)/40 (Mbps) which is 25%.

Figure 4:
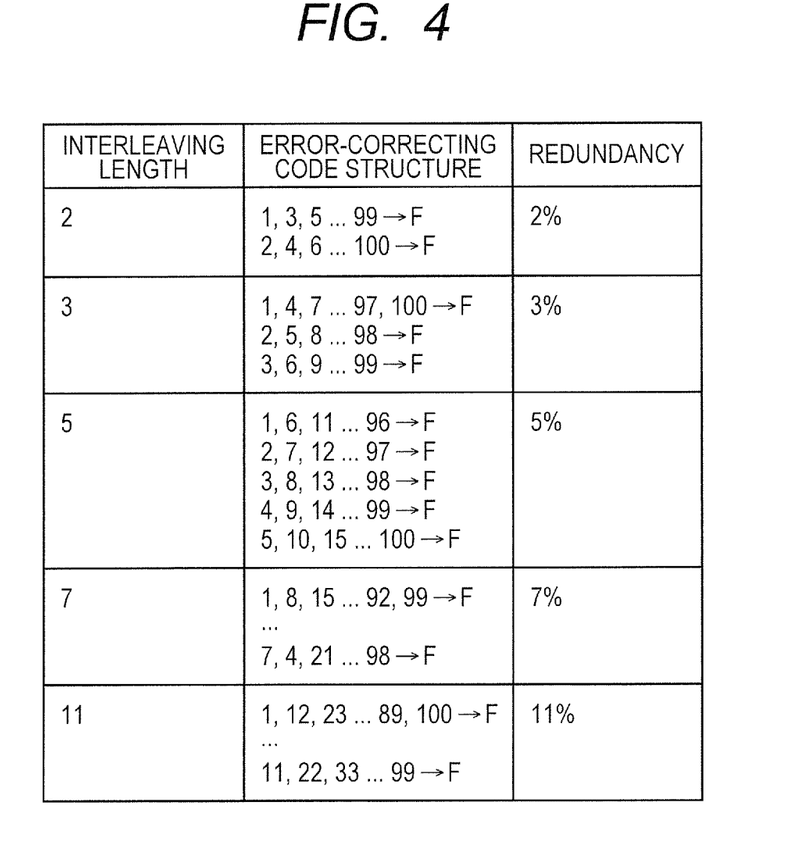
FIG. 4 is a diagram illustrating a correspondence between error-correcting code structure and redundancy.

In step S306, the error-correcting code setting module 207 calculates a plurality of patterns of the error-correcting code redundancy in different interleaving lengths. FIG. 4 illustrates a correspondence table of the interleaving length and the error-correcting code redundancy when the block length in generating the error-correcting codes is 100 packets. A first row indicates the interleaving length, indicating intervals for selecting data packets to be protected in generating the error-correcting codes. A second row indicates the structure of the error-correcting codes. The numbers express sequence numbers of the data packets to be protected, and "F" indicates the error-correcting code generated in the data packet group to be protected. A third row indicates the redundancy, indicating the ratio of the error-correcting codes to the blocks of data packets to be protected. If the interleaving length is increased, the number of data packets protected by one error-correcting code decreases, and the number of entire error-correcting code packets increases. When the maximum number of data packets that can be protected is calculated in step S304, the error-correcting code setting module 207 cannot select an interleaving length in which the number of protected data packets exceeds the maximum number of data packets. For example, when the maximum number of data packets is 30, the error-correcting code setting module 207 cannot select the interleaving length "2" (number of protected data packets 50) and the interleaving length "3" (number of protected data packets 34 or 33). Therefore, the error-correcting code setting module 207 determines a combination of a plurality of interleaving lengths such that the number of data packets protected by one error-correcting code falls within the maximum number of data packets. The interleaving lengths are prime numbers or values which do not have a common divisor, except for 1. Although all interleaving lengths are calculated in prime numbers in the example of FIG. 4, it is only necessary that the interleaving lengths do not have a common divisor, except for 1. For example, a combination of interleaving lengths "3", "4" and "5" is possible although 4 is not a prime number. In the present embodiment, all of the interleaving lengths are prime numbers in the combination, for the simplification of the description. In this way, the number of combinations of common data packets among the data packets protected by a plurality of error-correcting codes is reduced as much as possible. The combination of common data packets is, for example, a combination of data packets "1" and "7" in the error-correcting code structures of interleaving lengths "2" and "3" in the example of FIG. 4. If an error occurs in the data packets "1" and "7" in the error-correcting codes of parity method, recovery is not possible in the error-correcting codes of the interleaving lengths "2" and "3". There is a method for eliminating the combination of common data packets, and the method will be separately described in a second embodiment.

In step S307, the error-correcting code setting module 207 sets a minimum redundancy among the plurality of interleaving lengths calculated in step S306 as an initial value of a variable for holding a total redundancy. In the example of FIG. 4, the redundancy "2%" of the interleaving length "2" is set.

In step S308, the error-correcting code setting module 207 compares a current total redundancy and the available redundancy for the error-correcting code packets calculated in step S305. If the current total redundancy does not exceed the available redundancy, the process proceeds to step S309. If the current total redundancy exceeds the available redundancy, the process proceeds to step S310.

In step S309, the error-correcting code setting module 207 adds a minimum redundancy among the interleaving lengths not selected in the plurality of interleaving lengths calculated in step S306 to the variable holding the total redundancy. In the example of FIG. 4, the redundancy "3%" of the interleaving length "3" is added to the initial value "2%", and the total redundancy is "5%". The redundancy "5%" of the interleaving length "5" is added in the next addition. Subsequently, the process returns to step S308.

In step S310, the error-correcting code setting module 207 sets the number of times of adding the redundancy as a number of combinations x. For example, when the available redundancy of the error-correcting code packets calculated in step S305 is 25%, the pattern in which the total redundancy exceeds the available redundancy is 2(%)+3(%)+5 (%)+7(%)+11(%)=28%. In this case, since the number of times of adding the redundancy is 4, the number of combinations x is 4. Therefore, the error-correcting code setting module 207 determines the number of combinations x of the maximum interleaving lengths, such that the total redundancy of the error-correcting codes for the data packets corresponding to the combination of the plurality of interleaving lengths falls within the range of the available redundancy.

Figure 5:
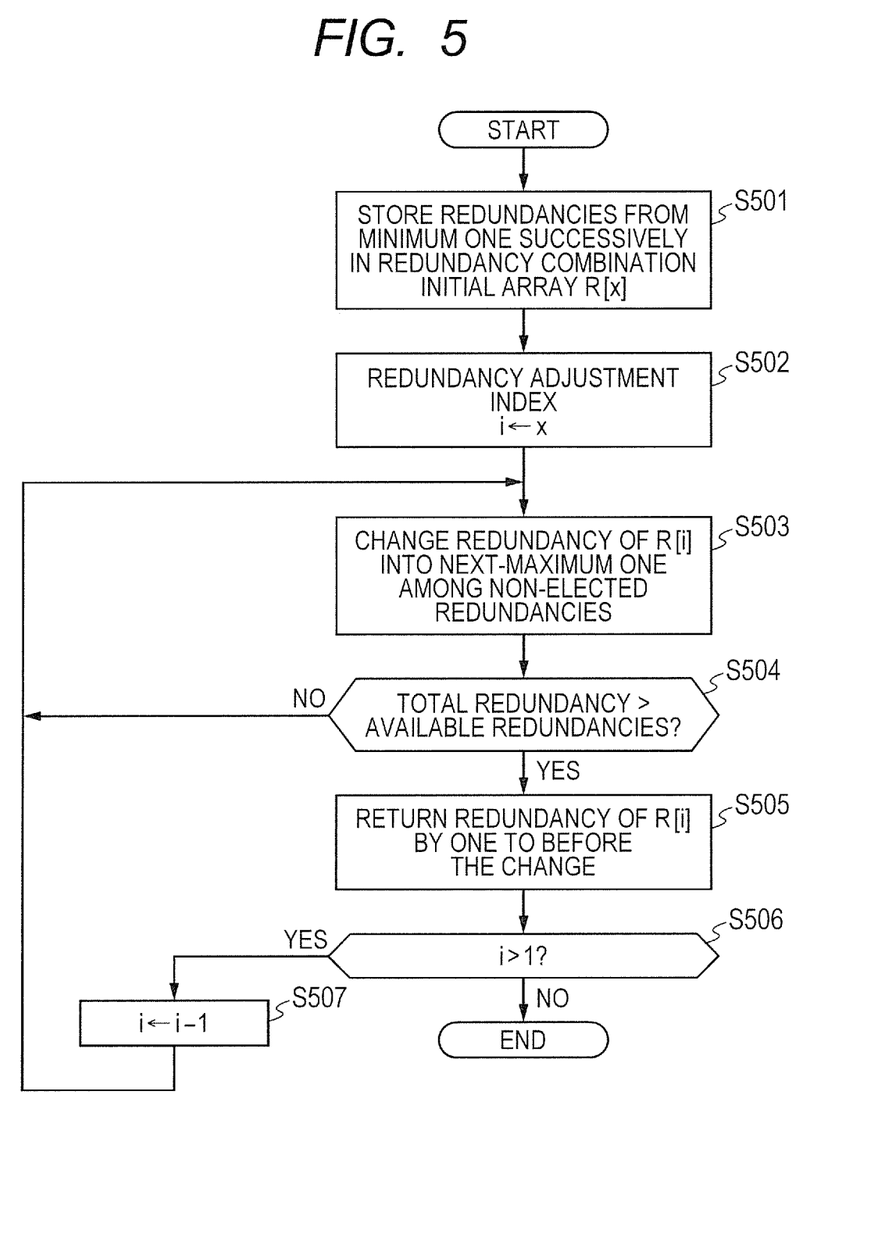
FIG. 5 is a flow chart for determining a combination of redundancies of error-correcting codes.

In step S311, the error-correcting code setting module 207 determines a combination of a plurality of interleaving lengths based on the number of combinations x determined in step S310. FIG. 5 illustrates a flow chart of an interleaving length combination determining method as an example of a determining method.

In step S501, the error-correcting code setting module 207 stores redundancies from minimum one successively in a redundancy combination array R [1 . . . x] in which the number of combinations x is the number of elements. For example, when the available redundancy of the error-correcting code packets calculated in step S305 is 25%, and the interleaving length pattern is as illustrated in FIG. 4, x=4, R[1]=2(%), R[2]=3(%), R[3]=5(%) and R[4]=7% are stored. The total redundancy in the initial state is 17%.

In step S502, the error-correcting code setting module 207 sets the number of combination x (=4) as an initial value of an index number i for adjusting the redundancy.

In step S503, the error-correcting code setting module 207 changes the redundancy of R[i] into the next-maximum redundancy among the non-selected redundancies of interleaving length. In the example, the redundancy is changed into R[4]=11(%).

In step S504, the error-correcting code setting module 207 compares the total redundancy changed in step S503 and the available redundancy. If the total redundancy is smaller than the available redundancy, the process returns to step S503. If the total redundancy is equal to or greater than the available redundancy, the process proceeds to step S505. In the example, the total redundancy is R[1](=2%)+R[2](=3%)+R[3](=5%)+R[4](=11%)=21% which is smaller than the available redundancy (=25%), and the process returns to step S503. Since the next-maximum redundancy is 13%, the redundancy is changed into R[4]=13(%), and the total redundancy is 23%. In this case, the total redundancy is smaller than the available redundancy (=25%), and the process returns again to step S503. Since the next-maximum redundancy is 17%, the redundancy is changed into R[4]=17(%), and the total redundancy is 27%. In this case, the total redundancy is equal to or greater than the available redundancy (=25%), and the process proceeds to step S505.

In step S505, the error-correcting code setting module 207 returns the redundancy of R[i] by one to before the change. Here, R[4] is returned from 17% to 13%.

In step S506, the error-correcting code setting module 207 compares whether the redundancy adjustment index number i is greater than 1. If the redundancy adjustment index number i is greater than 1, the process proceeds to step S507. If the redundancy adjustment index number i is equal to or smaller than 1, the error-correcting code setting module 207 determines the current redundancy combination array R [1 . . . x] as an ultimately determined redundancy and as a combination of the interleaving lengths corresponding to the redundancy.

In step S507, the error-correcting code setting module 207 decrements the redundancy adjustment index number i, and the process returns to step S503.

In the example, the redundancy is then changed into R[3]=7%, and the total redundancy is 25%. There is no change in the subsequent redundancy combination array R [1 . . . x], and the description will be omitted. R[1]=2(%), R[2]=3(%), R[3]=7(%) and R[4]=13(%) are determined as a final redundancy combination array.

The interleaving length combination determining method described in FIG. 5 is an example, and the method is not limited to this. The available redundancy of the error-correcting code packets is 25%. In the interleaving length pattern of FIG. 4, the total redundancy is also 25% in a combination of R[1]=2(%), R[2]=5(%), R[3]=7(%) and R[4]=11(%), and an algorithm for selecting this may be adopted.

As described, in step S311 of FIG. 3, the error-correcting code setting module (second determining unit) 207 determines the combination of the plurality of interleaving lengths indicating the intervals of the plurality of data packets for which the error-correcting codes are generated. The error-correcting code setting module (second determining unit) 207 determines the combination of the plurality of interleaving lengths, such that the total redundancy of the error-correcting codes for the data packets corresponding to the combination of the plurality of interleaving lengths is the maximum within the range of available redundancy. The error-correcting code generating module (generating unit) 208 generates the error-correcting codes for the data packets based on the combination of the plurality of interleaving lengths determined by the error-correcting code setting module (second determining unit) 207.

Second Embodiment

The method of setting the interleaving lengths to prime numbers or values which do not have a common divisor except for 1 to thereby reduce as much as possible the number of combinations of common data packets among the data packets protected by the plurality of error-correcting codes is described in the first embodiment. A method of eliminating the combination of common data packets among the data packets to be protected in all error-correcting codes will be described in the second embodiment of the present invention. The hardware configuration and the module configuration of the present embodiment are common with those of the first embodiment, and the description will not be repeated.

In addition to setting the interleaving lengths to prime numbers or values which do not have a common divisor except for 1 that is the condition of the first embodiment, a minimum interleaving length is set in the present embodiment such that a value of the square of the interleaving length is equal to or greater than the block length. This can eliminate the combination of common data packets in the data packet group protected by the plurality of error-correcting code packets.

Figure 6:
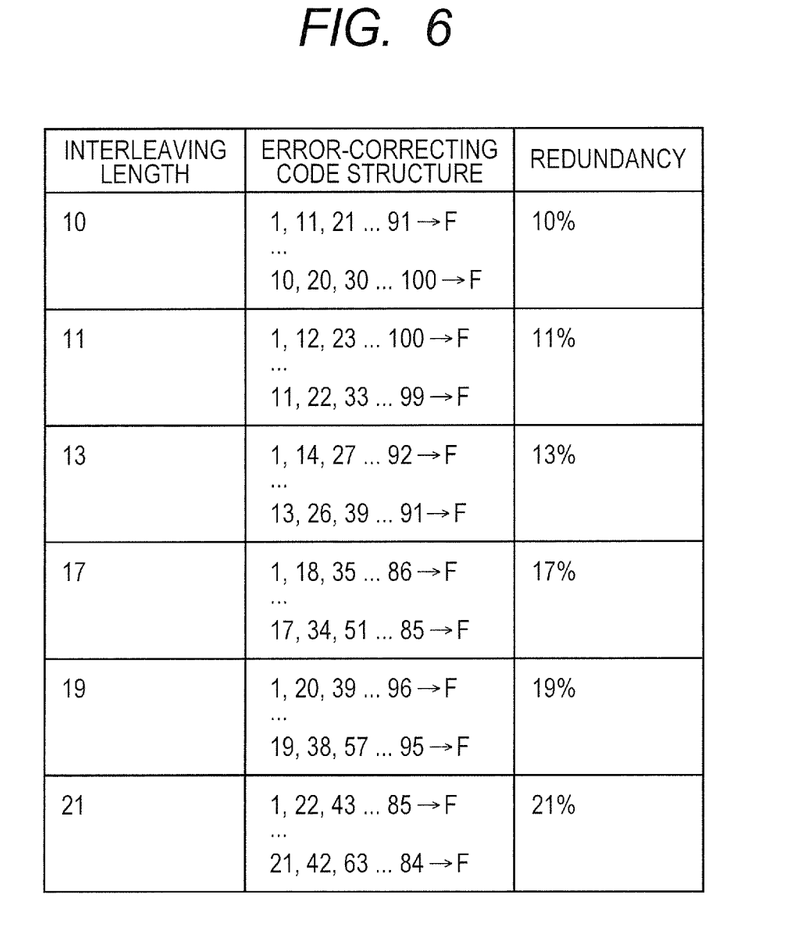
FIG. 6 is a diagram illustrating a correspondence between error-correcting code structure and redundancy.

FIG. 6 illustrates a correspondence between the interleaving length and the error-correcting code redundancy, in which the block length is 100 packets, and the minimum interleaving length is set such that the value of the square of the interleaving length is equal to or greater than the block length. The minimum interleaving length when the block length is 100 packets is $100^{1/2}$ which is 10. After 10, the redundancies are calculated based on interleaving lengths which do not include a common divisor, except for 1. For example, the interleaving lengths are 10, 11, 13, 17, 19 and 21.

Figure 7:
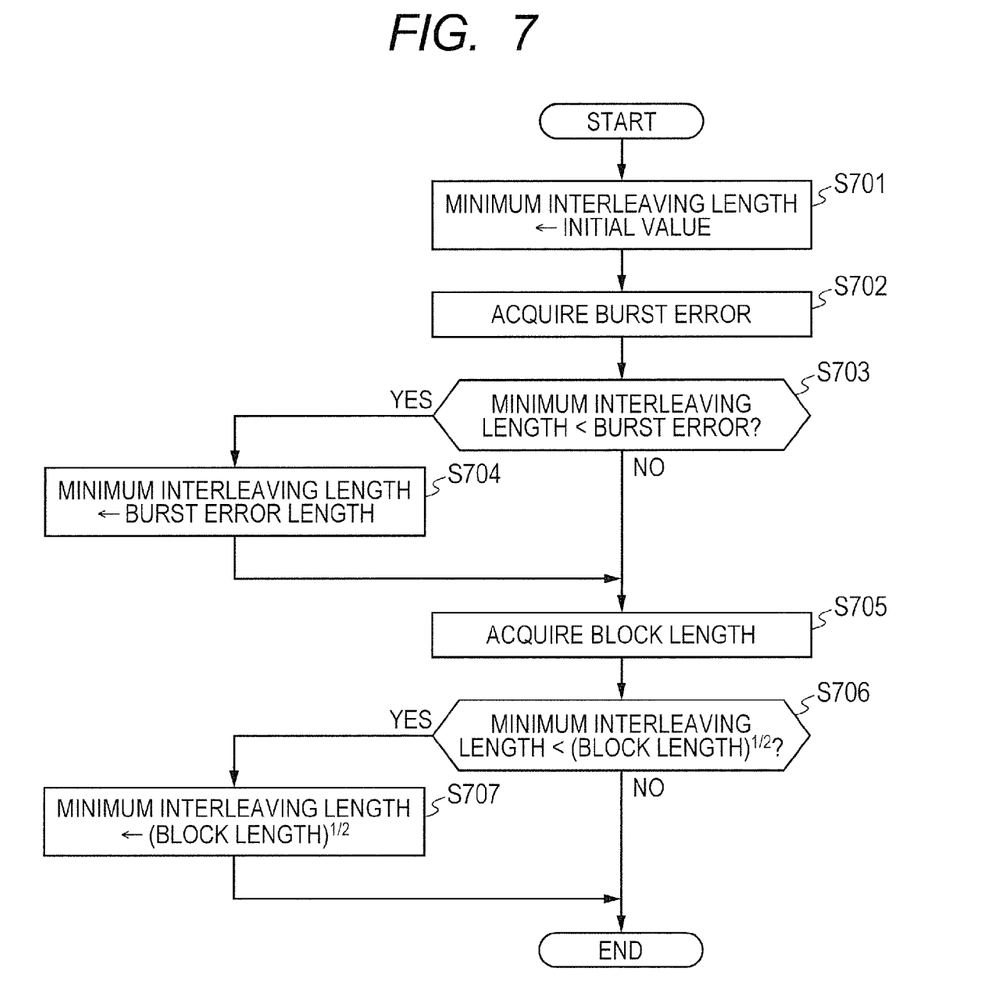
FIG. 7 is a flow chart for determining a minimum interleaving length.

An initial value that is set in advance may be used as the minimum interleaving length. The communication state comprehension module 205 may record a burst error length, and the error-correcting code setting module 207 may dynamically set the minimum interleaving length according to the burst error length. FIG. 7 illustrates an example of a flow chart of the minimum interleaving length determining method using all of these. The process of FIG. 7 is executed as preprocessing of the redundancy calculation process of step S306 in FIG. 3.

In step S701, the error-correcting code setting module 207 sets the initial value that is set in advance as a variable for holding the minimum interleaving length. In step S702, the error-correcting code setting module 207 acquires the burst error length from the communication state comprehension module 205. A time limit for holding the record of the burst error length may be set. For example, the value may be reset after a certain time from the last burst error, or the value may be gradually reduced.

In step S703, the error-correcting code setting module 207 compares the minimum interleaving length and the burst error length acquired in step S702. If the minimum interleaving length is smaller than the burst error length, the process proceeds to step S704. If the minimum interleaving length is equal to or greater than the burst error length, the process proceeds to step S705.

In step S704, the error-correcting code setting module 207 sets the minimum interleaving length to the burst error length, and the process proceeds to step S705. In step S705, the error-correcting code setting module 207 acquires the block length calculated in step S303 of FIG. 3.

In step S706, the error-correcting code setting module 207 compares the minimum interleaving length and a value of (the block length (acquired in step S705))$^{1/2}$. If the minimum interleaving length is smaller than the value of (the block length)$^{1/2}$, the process proceeds to step S707. If the minimum interleaving length is equal to or greater than the value of (the block length)$^{1/2}$, the minimum interleaving length is maintained, and the present process ends.

In step S707, the error-correcting code setting module 207 sets the minimum interleaving length to the value of (the block length)$^{1/2}$, and the present process ends.

Figure 8:
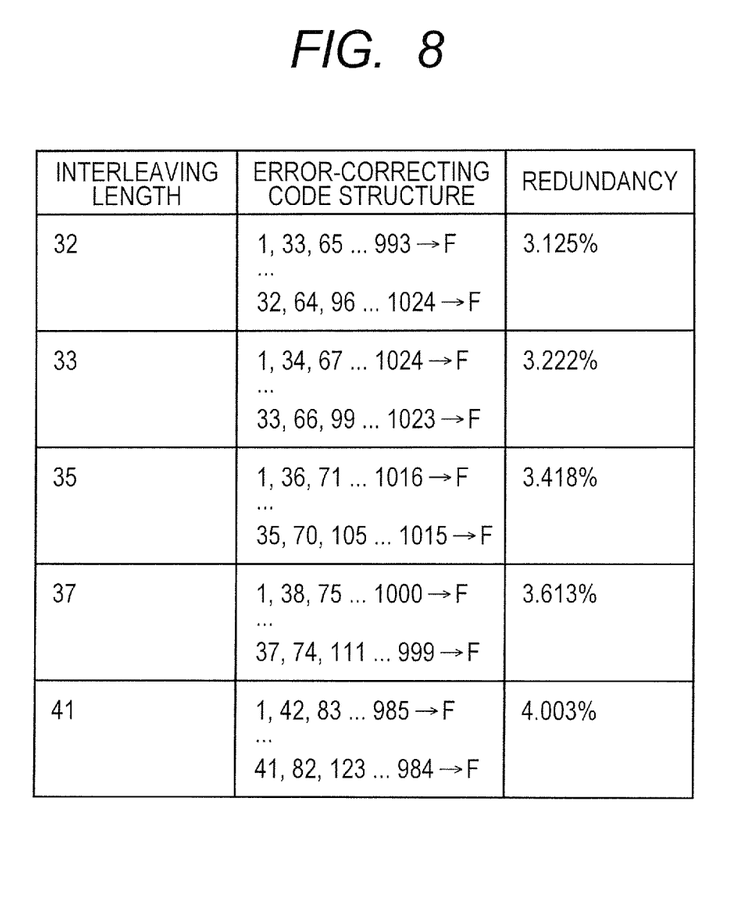
FIG. 8 is a diagram illustrating a correspondence between error-correcting code structure and redundancy.

In the example of FIG. 6, the block length of 100 is small, and the minimum redundancy of 10% corresponding to the minimum interleaving length is high. However, the minimum redundancy can be reduced when the block length is large. FIG. 8 illustrates an example of a correspondence between the interleaving length and the error-correcting code redundancy, in which the block length is 1024 packets, and the minimum interleaving length is set such that the value of the square of the interleaving length is equal to or greater than the block length. The minimum interleaving length when the block length is 1024 packets is 1024$^{1/2}$ which is 32. The redundancy of the minimum interleaving length is 3.125%, and the redundancy can be set in a range lower than when the block length is 100. The block length may be controlled according to the conditions, or the block length may be gradually controlled in the first and second embodiments. For example, in a system that puts more emphasis on the quality of video than the real-time property, the block length may be controlled, or particularly, the block length may be intentionally increased, to allow flexible control of the redundancy for the error-correcting codes in the limited available communication band. The block length may be increased when the minimum redundancy corresponding to the minimum interleaving length cannot be transmitted in the communication band available for the error-correcting codes.

Although the first and second embodiments are described in detail, the present invention can be embodied by a system, an apparatus, a method, a program or a recording medium (storage medium), for example. Specifically, the present invention may be applied to a system including a plurality of devices (such as a host computer, an interface device, an imaging apparatus and a web application), or the present invention may be applied to an apparatus including one device.

A program of software for realizing the functions of the embodiments can be directly or remotely supplied to a system or an apparatus, and a computer of the system or the apparatus can read and execute the supplied program code to attain the present invention. The program in this case is computer-readable and is a program corresponding to the flow charts illustrated in the drawings in the embodiments.

Therefore, the program code installed on the computer to realize the functional processing of the present invention in the computer also realizes the present invention. Thus, the present invention also includes a computer program for realizing the functional processing of the present invention.

In this case, forms, such as an object code, a program executed by an interpreter, and script data supplied to an OS, can be adopted as long as the functions of the program are included.

Examples of the recording medium for supplying the program include media, such as a Floppy (registered trademark) disk, a hard disk, an optical disk, a magneto-optical disk, an MO, a CD-ROM, a CD-R, a CD-RW, a magnetic tape, a non-volatile memory card, a ROM and a DVD (DVD-ROM, DVD-R).

Other examples of the method for supplying the program include the following methods. An Internet homepage is accessed from a browser of a client computer, and the computer program of the present invention (or a compressed file having an automatic installation function) is downloaded from the homepage to a recording medium such as a hard disk. Alternatively, the program code of the program of the present invention can be divided into a plurality of files, and the files can be downloaded from different homepages. Therefore, the present invention also includes a WWW server that allows a plurality of users to download the program files for realizing the functional processing of the present invention in the computer.

The program of the present invention can be encrypted and stored in a storage medium such as a CD-ROM, and the program can be distributed to a user. The user that cleared predetermined conditions can download key information for decrypting the encryption from a homepage through the Internet. Therefore, the user can use the key information to execute the encrypted program and can install the program on the computer.

The computer executes the read program to realize the functions of the embodiments. An OS operating on the computer can execute part or all of the actual process based on an instruction of the program, and the process can realize the functions of the embodiments.

The program read from the recording medium is written in a memory included in a function extension board inserted to the computer or a function extension unit connected to the computer, and the program is then executed to realize the functions of the embodiments. Therefore, a CPU included in the function extension board or the function extension unit can execute part or all of the actual process based on the instruction of the program.

In the embodiments, the communication band available for the error-correcting code packets and the tolerable delay time in the receiving apparatus are taken into account to generate the error-correcting code packets by increasing the error resistance of the data packets to be protected as much as possible. This enables medium transmission using error-correcting codes without tightening the communication band, while maintaining the real-time property.

The embodiments are intended to illustrate examples for implementing the present invention and should not be construed as limiting the technical scope of the present invention. Therefore, the present invention can be implemented in various forms without departing from the technical scope of the present invention or the main features of the present invention.

According to the embodiments, error-correcting codes can be generated without tightening the communication band, while maintaining the real-time property.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-226204, filed Nov. 6, 2014, which is hereby incorporated by reference herein in its entirety.

What is claimed is:

1. A generating apparatus generating error-correcting code for data packet comprising:
a first determining unit configured to determine a redundancy range for the error-correcting code;
a second determining unit configured to determine a combination of a plurality of interleaving lengths indicating an interval of a plurality of data packets for which the error-correcting code is generated; and
a generating unit configured to generate the error-correcting code for the data packet, based on the combination of the plurality of interleaving lengths determined by the second determining unit, wherein
the second determining unit determines the combination of the plurality of interleaving lengths, such that a total redundancy of the error-correcting codes for the data packets falls within a range of redundancy determined by the first determining unit.

2. The generating apparatus according to claim 1, wherein the second determining unit determines the combination of the plurality of interleaving lengths which do not have a common divisor, except for 1.

3. The generating apparatus according to claim 1, wherein the first determining unit determines the redundancy range, based on an available communication band.

4. The generating apparatus according to claim 1, further comprising
a third determining unit determining a block length indicating a number of the data packets selectable for generating the error-correcting code based on a tolerable delay time.

5. The generating apparatus according to claim 1, further comprising
a third determining unit determining a block length indicating a number of the data packets selectable for generating the error-correcting code based on an available quantity of a memory.

6. The generating apparatus according to claim 1, wherein the second determining unit determines a maximum number of the combination of the interleaving lengths such that a total redundancy of the error-correcting code for the data packets corresponding to the plurality of interleaving lengths within a redundancy range determined by the first determining unit, and then determines the combination of the plurality of interleaving lengths based on the determined maximum number of the combination of the interleaving lengths.

7. The generating apparatus according to claim 1, further comprising
a maximum data packet number determining unit configured to determine a maximum number of the data packet protected by one error-correction code based on a communication error rate, wherein
the second determining unit determines the combination of the plurality of interleaving lengths, such that the maximum number of the data packet protected by the one error-correction code falls within a maximum number of data packets.

8. The generating apparatus according to claim 1, wherein a minimum interleaving length among the plurality of interleaving lengths is set as an initial value.

9. The generating apparatus according to claim 1, wherein a minimum interleaving length among the plurality of interleaving lengths is a burst error length.

10. The generating apparatus according to claim 4, wherein
a minimum interleaving length among the plurality of interleaving lengths has a value according to the block length.

11. A generating method for generating error-correcting code for data packet comprising:
a first determining, a redundancy range for the error-correcting code;
a second determining a combination of a plurality of interleaving lengths indicating an interval of a plurality of data packets for which the error-correcting code is generated; and
generating, the error-correcting code for the data packet, based on the combination of the plurality of interleaving lengths determined by the second determining unit, wherein
the second determining is performed to determine the combination of the plurality of interleaving lengths, such that a total redundancy of the error-correcting codes for the data packets falls within a range of redundancy determined by the first determining.

12. A non-transitory computer-readable recording medium storing a readable program for operating a computer to execute a generating method for generating error-correcting code for data packet comprising:
a first determining a redundancy range for the error-correcting code;
a second determining a combination of a plurality of interleaving lengths indicating an interval of a plurality of data packets for which the error-correcting code is generated; and
generating the error-correcting code for the data packet, based on the combination of the plurality of interleaving lengths determined by the second determining unit, wherein
the second determining is performed to determine the combination of the plurality of interleaving lengths, such that a total redundancy of the error-correcting codes for the data packets falls within a range of redundancy determined by the first determining.

* * * * *